United States Patent
Bao

(10) Patent No.: US 8,344,811 B2
(45) Date of Patent: Jan. 1, 2013

(54) DUAL-BAND VOLTAGE-CONTROLLED OSCILLATOR ARRANGEMENT

(75) Inventor: Mingquan Bao, Vastra Frolunda (SE)

(73) Assignee: Telefonaktiebolaget L M Ericsson (publ), Stockholm (SE)

(*) Notice: Subject to any disclaimer, the term of this patent is extended or adjusted under 35 U.S.C. 154(b) by 0 days.

(21) Appl. No.: 12/993,153

(22) PCT Filed: May 30, 2008

(86) PCT No.: PCT/SE2008/050637
§ 371 (c)(1),
(2), (4) Date: Nov. 17, 2010

(87) PCT Pub. No.: WO2009/145686
PCT Pub. Date: Dec. 3, 2009

(65) Prior Publication Data
US 2011/0074513 A1    Mar. 31, 2011

(51) Int. Cl.
*H03L 7/00* (2006.01)
(52) U.S. Cl. .......... 331/2; 331/50; 331/46; 331/56; 331/36 R; 331/167; 331/179
(58) Field of Classification Search ........ 331/2, 46, 331/36 R, 50, 56
See application file for complete search history.

(56) References Cited

U.S. PATENT DOCUMENTS

| | | |
|---|---|---|
| 3,361,986 A | 1/1968 | Catania |
| 3,939,429 A | 2/1976 | Lohn et al. |
| 8,067,987 B2 * | 11/2011 | Sen et al. .......... 331/2 |
| 2006/0033587 A1 | 2/2006 | Cabanillas |
| 2006/0255873 A1 | 11/2006 | Kobayashi |
| 2008/0007366 A1 | 1/2008 | Bevilacqua et al. |
| 2008/0129403 A1 | 6/2008 | Jang et al. |

OTHER PUBLICATIONS

Zirath, H., et al., "MMIC-Oscillator designs for ultra low phase noise", CSIC 2005 Digest, 2005, pp. 204-207.
Baek, D., et al., "A Dual-Band (13/22-GHz) VCO Based on Resonant Mode Switching", IEEE Microwave and Wireless Components Letters, IEEE Service Center, New York, NY, US, vol. 13, No. 10, Oct. 1, 2003, pp. 443-445, XP011102138.
Casha, O., et al., "Comparative study of gigahertz CMOS LC quadrature voltage-controlled oscillators with relevance to phase noise", Analog Integrated Circuits and Signal Processing, Kluwer Academic Publishers, Bo, vol. 52, No. 1-2, Aug. 22, 2007, pp. 1-14, XP019523207.
Kral, A., et al., "RF-CMOS Oscillators with Switched Tuning", Custom Integrated Circuits Conference, 1998, Proceedings of the IEEE 1 998 Santa Clara, CA, US, May 11-14, 1998, New York, NY, USA, IEEE, US, May 11, 1998, pp. 555-558 XP010293959.
Supplementary European Search Report dated Oct. 25, 2012, from corresponding application No. EP08779320, 10 pages.

* cited by examiner

*Primary Examiner* — Arnold Kinkead
(74) *Attorney, Agent, or Firm* — Rothwell, Figg, Ernst & Manbeck, P.C.

(57) ABSTRACT

In a dual-band capable voltage-controlled oscillator (VCO) device at least two voltage-controlled oscillator units (VCO1, VCO2) are coupled via a reactive component (A) and each said at least one voltage-controlled oscillator unit (VCO1, VCO2) further being connected to at least a respective external switching device (B1, B2) adapted to control an operating frequency of the (VCO) device.

14 Claims, 11 Drawing Sheets

(a)

(b)

(a) (b)

DUAL-BAND VOLTAGE-CONTROLLED OSCILLATOR ARRANGEMENT

CROSS-REFERENCE TO RELATED APPLICATION

This application is a 35 U.S.C. §371 National Phase Entry Application from PCT/SE2008/050637, filed May 30, 2008, and designating the United States.

TECHNICAL FIELD

The present invention concerns voltage-controlled oscillators in general; especially a dual-band voltage-controlled oscillator (VCO) with improved phase noise and tuning range.

BACKGROUND

The development of wireless communication systems has increased the demand for monolithically integrated, low-cost and low-phase-noise voltage controlled oscillators (VCO:s). At the same time, the development for several communication standards utilizing different frequency bands has pushed researchers to develop multi-band as well as multi-standard transceivers. This has, in turn, forced researchers to look for multi-band VCO:s, especially dual-band VCO:s. One of the major driving forces for the development of such transceivers is the need for multi-band VCO:s with good phase noise performance.

In brief, a voltage-controlled oscillator (VCO) is a fundamental building block in a transceiver system. It provides a local oscillation (LO) signal source for a mixer that translates an intermediate frequency (IF) to a radio frequency (RF), or vice versa. For a dual-band transceiver system, two single-band VCO:s or one dual-band oscillator is utilized.

There are several known approaches to design and build a dual-band VCO. For instance, switched capacitors or inductors can be used to construct a dual-band VCO, as shown in FIG. 1, [2]. Unfortunately, the switch's parasitic capacitance and channel resistance have negative impact on the VCO tuning range and phase noise performance. Recently, the mutual inductances of two coupled transmission lines or a transformer have been utilized to build a dual-band VCO [3], as shown in FIG. 2 and FIG. 3. For further information concerning the concept of mutual inductance, see Appendix 1. In such a VCO, the frequency band is set and determined by the phase difference between the respective currents $I_1$ and $I_2$, as shown in FIG. 3(c). When the two currents $I_1$ and $I_2$ are in-phase the total inductance is determined according to $L_i=L_{s,i}+M$, and when $I_1$ and $I_2$ are in anti-phase the total inductance is determined according to $L_i=L_{s,j}-M$, where $L_i$ (i=1,2) is the total inductance of a primary or secondary coil, $L_{s,j}$ is the self-inductance, M is mutual inductance. The corresponding oscillation frequency of the oscillator device then becomes, according to Equation 1:

$$f_0 = \frac{1}{2\pi\sqrt{(L_{s,j} \pm M)C}} \quad (1)$$

Here, for the sake of simplicity, the respective inductance $L_{p1}$ and $L_{s1}$ are assumed to have the same value $L_{s1}$, and the capacitances $C_{p1}$ and $C_{s1}$ to have the same value C. In practice, the aforementioned transformer together with parallel capacitors, as shown in FIG. 2(b) and FIG. 3(c), make up a dual-mode resonator, and its frequency band depends on the phase difference of $I_1$ and $I_2$.

Even though using transformers in dual-band VCO's avoids the problems caused by switches in the resonator, a transformer has its own problems, i.e. its quality factor becomes poor when the mutual inductance is negative [3]. The relation between the resonance frequency and resonance width of the oscillator typically determines the quality factor.

Therefore, there is a need for a dual-band voltage-controlled oscillator arrangement that avoids or reduces the above-mentioned disadvantages.

SUMMARY

An object of the present invention is to provide an improved dual-band voltage controlled oscillator.

Basically, a dual-band capable voltage-controlled oscillator (VCO) device according to the present invention comprises at least two voltage-controlled oscillator units (VCO1, VCO2), coupled via a reactive component (A) and each said at least one voltage-controlled oscillator unit (VCO1, VCO2) further being connected to at least a respective external switching device (B1, B2) adapted to control an operating frequency of the VCO device.

Advantages of the present invention include:
Since the switches in the present VCO device are not connected with the resonator directly, the switches do not deteriorate the phase noise and tuning range of the VCO device.
The quality factors of the present dual-mode resonator's are not associated with the resonator mode, i.e. frequency band.

BRIEF DESCRIPTION OF THE DRAWINGS

The invention, together with further objects and advantages thereof, may best be understood by referring to the following description taken together with the accompanying drawings, in which:

FIG. 2a discloses a dual band VCO utilizing mutual inductance of a transformer;

FIG. 2b discloses a dual-mode resonator of the dual-band VCO in FIG. 2a;

FIG. 6a illustrates the trans-impedance of a dual-mode resonator;

FIG. 6b illustrates the impedances at the emitter of a transistor;

FIG. 6c illustrates the trans-conductance of an amplifier when $Z_{low}$ is on and $Z_{high}$ is off;

FIG. 6d illustrates the trans-conductance of an amplifier when $Z_{low}$ is off and $Z_{high}$ is on;

FIG. 11a illustrates yet another embodiment of the present invention;

FIG. 11b illustrates an ac grounded reactive component useable for common mode in the embodiment of FIG. 11a;

FIG. 11c illustrates an ac grounded reactive component useable for differential mode in the embodiment of FIG. 11a;

ABBREVIATIONS

CMOS Complementary Metal-Oxide Semiconductor
FET Field Effect Transistor
HBT Heterojunction Bipolar Transistor
GaA Gallium Arsenide
MMIC Monolithic Microwave Integrated Circuits
VCO Voltage Controlled Oscillator

DETAILED DESCRIPTION

The present invention will be discussed in the context of a general integrated circuit scheme applicable to any communication technology utilizing dual or even multiple frequency bands. The proposed VCO topology can be implemented in any semiconductor technology, e.g., CMOS, bipolar, Silicon, GaAs etc. It can be fully integrated on a chip but can also be made with discrete components or a mixture of ICs and discrete components.

A basic idea of the present invention is to make use of lumped-elements dual-mode resonators to design a dual-band VCO circuit or device. Its frequency band is determined by the phase difference (in- and anti-phase) of injected currents into the resonator.

Utilizing the mutual inductance of coupled transmission lines or transformers is one of the methods to design a dual-mode resonator. In this disclosure, other types of dual-mode resonators will be disclosed and discussed. All those dual-resonators serve the same purpose of enabling avoiding the variation in the quality factor for different modes.

Basically, the present invention provides a dual-mode voltage-controlled oscillator (VCO) device where switching and control is provided outside the actual resonators e.g. outside the tank of the resonator. Consequently, the phase noise and the tuning range of the resonator are not degraded by any parasitic capacitance or channel resistance within the resonator. In addition, the quality factor of the VCO is not dependent of the resonator mode i.e. frequency band.

Figure 1:
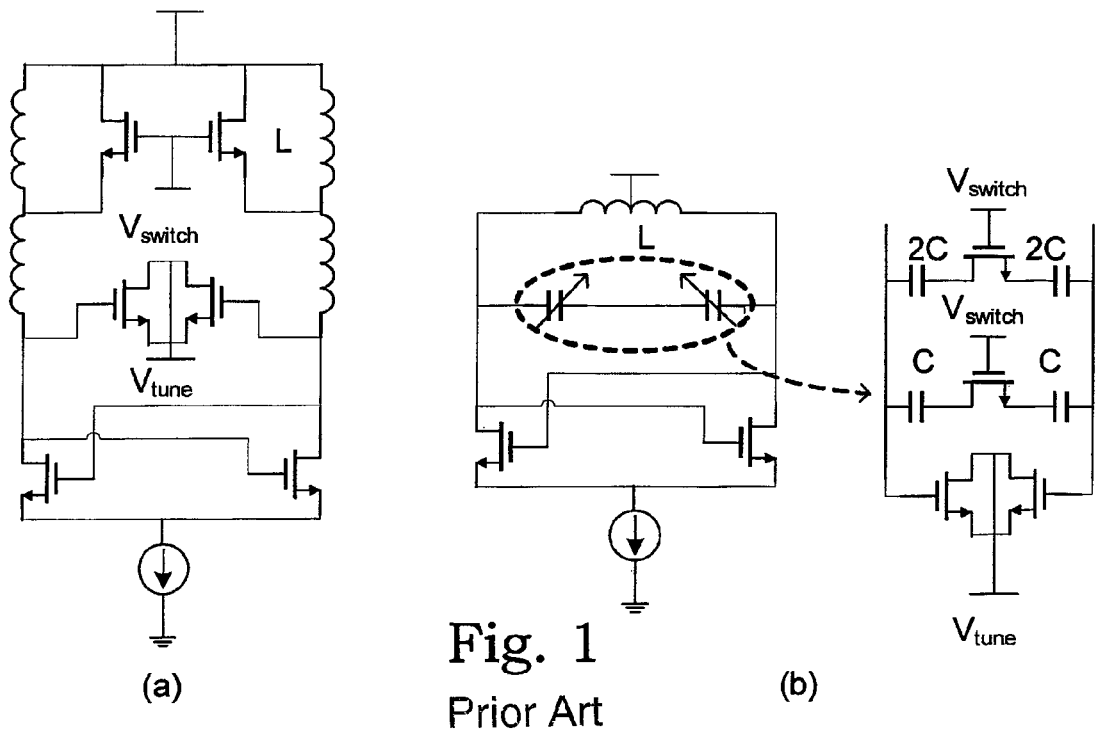
FIG. 1a discloses a known dual-band VCO utilizing switched series inductors.
FIG. 1b discloses a known dual-band VCO utilizing switched parallel capacitors.
Figure 4:
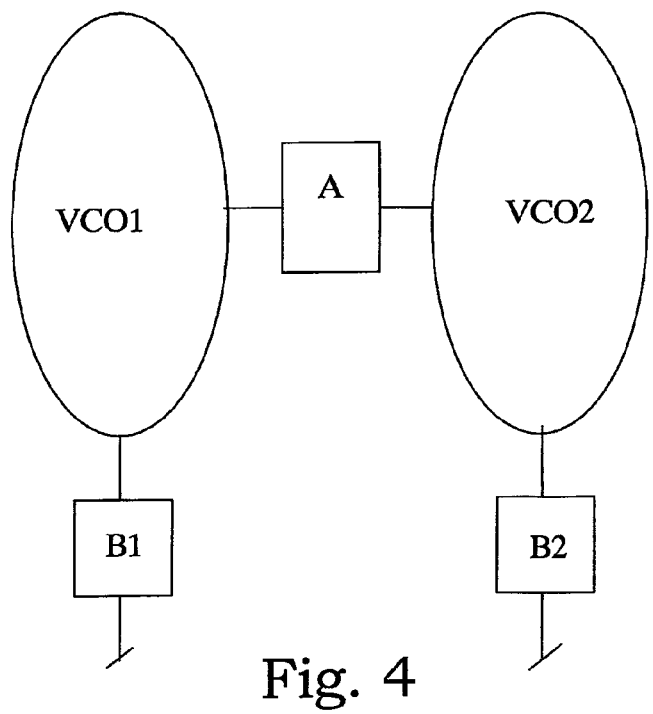
FIG. 4 discloses an embodiment of a dual-mode VCO device according to the present invention.
Figure 2:
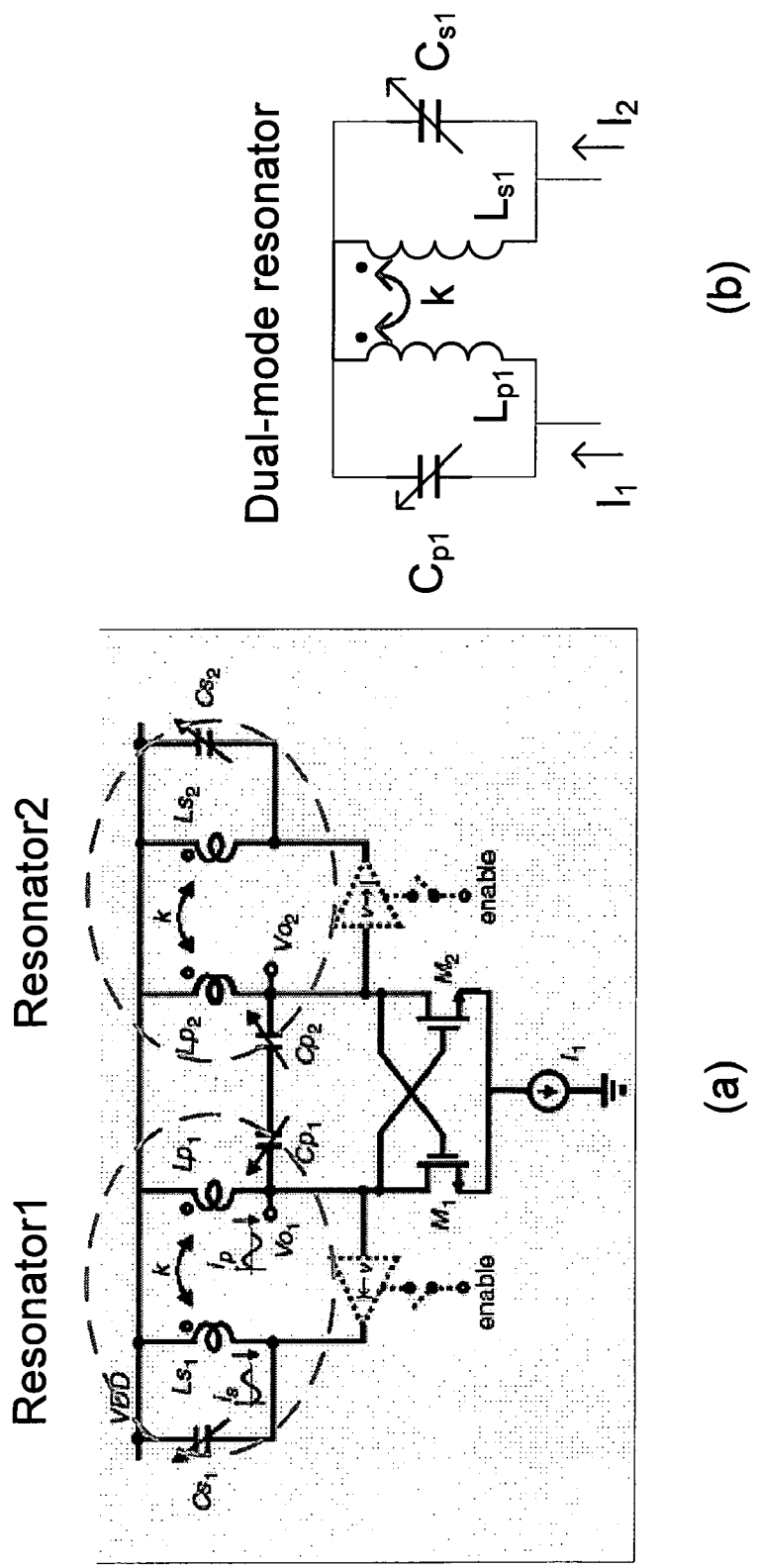
Figure 3:
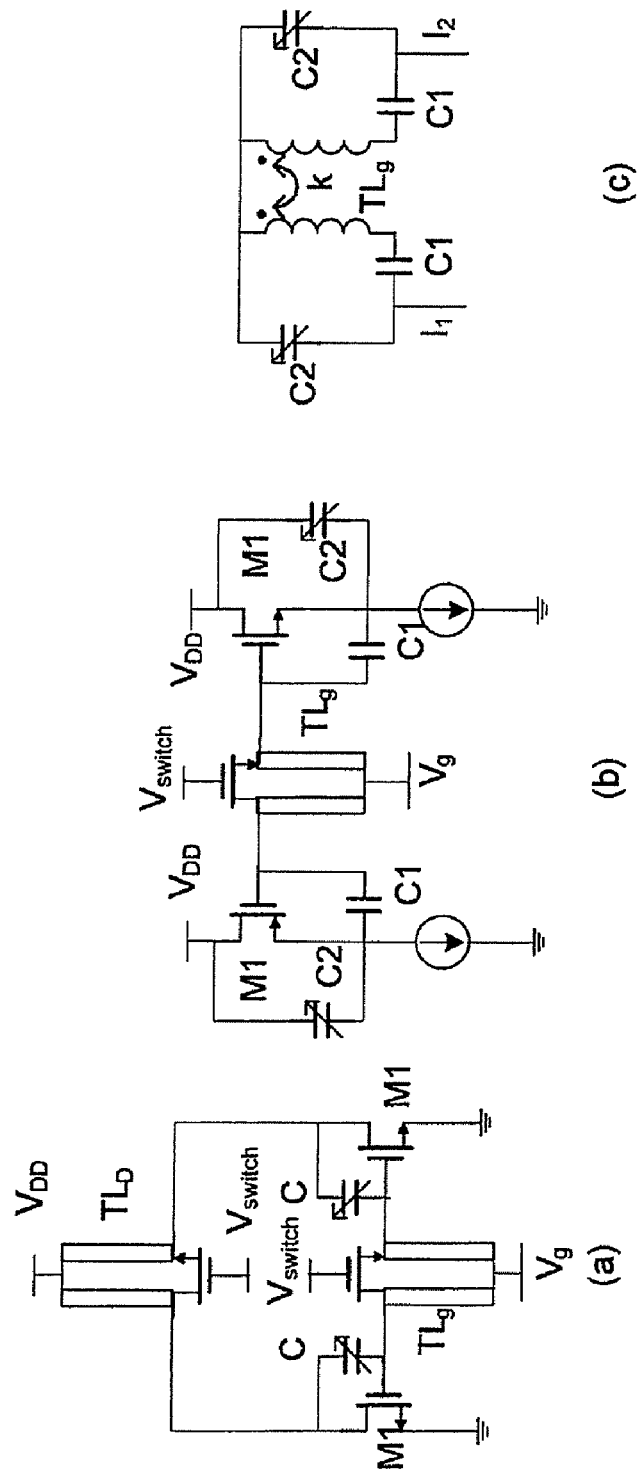
FIG. 3a discloses a known dual-band Hartley VCO utilizing switches across coupled transmission lines.
FIG. 3b discloses a known dual-band Colpitts VCO utilizing switches across coupled transmission lines.
FIG. 3c discloses a dual-band resonator for the Colpitts VCO of FIG. 3b.

With reference to FIG. 4, a general embodiment of a dual-band voltage controlled oscillator device VCO according to the present invention comprises at least two voltage controlled oscillator units VCO1, VCO2 coupled via a reactive component A. Each voltage controlled oscillator unit VCO1, VCO2 is connected to at least a respective external switching device B1, B2 adapted to control an operating frequency of said VCO.

Depending on the type of resonators of the device, the reactive component can be a coupling reactive component e.g. a capacitor, or an ac grounded component e.g. an inductor or a capacitor at a virtual ground port of the VCO. It is also equally applicable to provide these two reactive types of components as reactive circuits.

Figure 5:
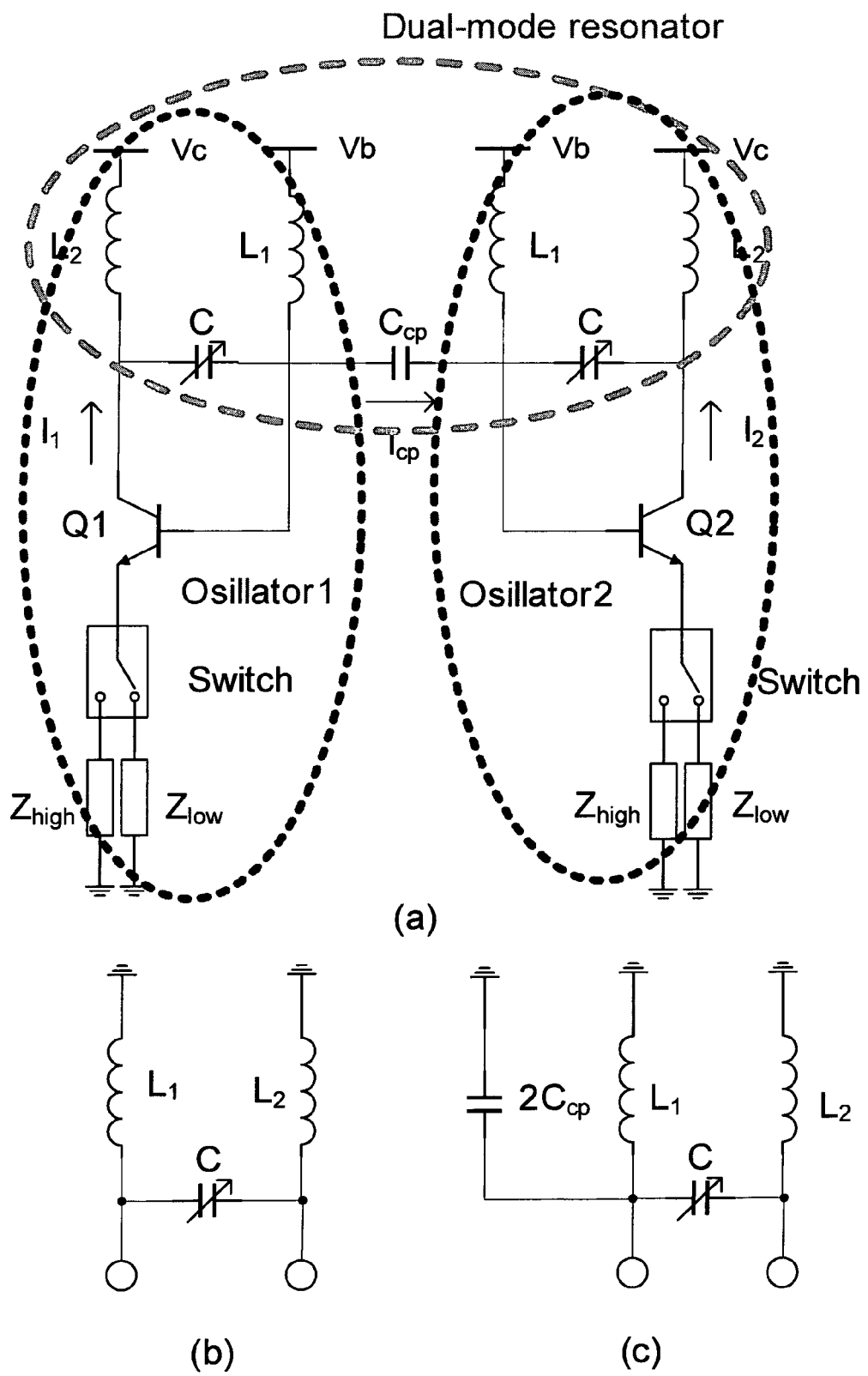
FIG. 5a discloses an embodiment of a dual-band VCO device.
FIG. 5b discloses the equivalent resonator circuit for the embodiment of FIG. 5a for common-mode.
FIG. 5c discloses the equivalent resonator circuit for the embodiment of FIG. 5a for differential mode.

A first type of an embodiment of a dual-band VCO device according to the present invention is shown in FIG. 5a. It is a combination of two single-ended Hartley VCO:s as represented by Oscillator 1 and Oscillator 2 which are coupled via a reactive component A, in this case represented by a capacitor $C_{cp}$. The two Hartley resonators (consisting of L1, L2 and C) plus a coupling capacitor $C_{cp}$ make up a dual-mode resonator. When two transistors (amplifiers) operate in common-mode, namely, they deliver in-phase collector current into the resonator; there is no current flowing through the capacitor $C_{cp}$, the equivalent resonator circuit is shown in FIG. 5b. Its resonator frequency is the same as a single-ended Hartley VCO, which is given by Equation 2:

$$f_0 = \frac{1}{2\pi\sqrt{(L_1+L_2)C}} \quad (2)$$

When two transistors (amplifiers) operate in differential mode, namely, they deliver anti-phase collector current into the resonator; there is a current flowing through the capacitor $C_{cp}$. Consequently, this capacitor becomes part of the resonator. The equivalent resonator circuit is shown in FIG. 5c, and its resonator frequency $f_d=\omega_d/(2\pi)$ is determined by the following Equation 3:

$$2L_1L_2CC_{cp}\omega_d^4-[2L_1L_2C_{cp}+(L_1+L_2)C]\omega_d^2+1=0 \quad (3)$$

Figure 6:
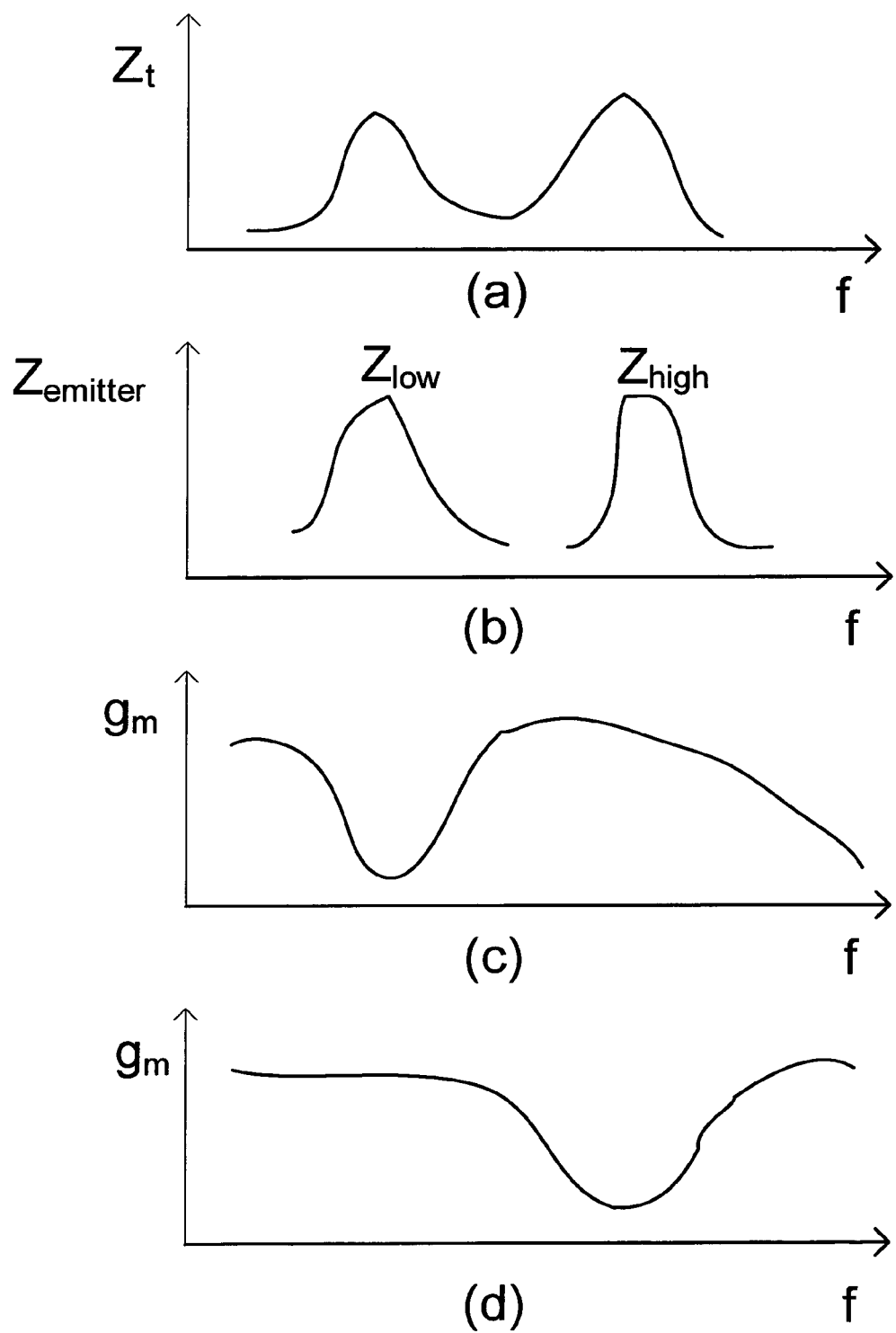

Obviously, the capacitor $C_{cp}$ can be replaced by an inductor $L_{cp}$ to build a similar dual-mode resonator. For a dual-mode resonator, the resonator's trans-impedance $Z_t$ has two peaks, as shown in FIG. 6a.

In the proposed VCO, transistors Q1/Q2 (amplifiers) provide gain, to overcome the loss of the resonator. According to the so-called Barkhausen criteria, the loop gain of the VCO should be equal to 1, i.e., $g_m \cdot Z_t=1$ where $g_m$ is the amplifier's trans-conductance. For a dual-band VCO, the $g_m$ of the amplifier needs to be variable. Here, $Z_{low}$ and $Z_{high}$ are added at the emitter to control the $g_m$'s frequency response, and their impedances are peaked at low and high frequency, respectively, as shown in FIG. 6b. As $Z_{low}$ is on and $Z_{high}$ is off, the amplifier has a large gain at a high frequency but a small gain at a low frequency, as shown in FIG. 6c. In this case, the VCO works only at higher frequency band. In contrast, as $Z_{high}$ is on and $Z_{low}$ is off, the $g_m$'s frequency response is shown in FIG. 6d, the VCO operates at low frequency band.

Figure 7:
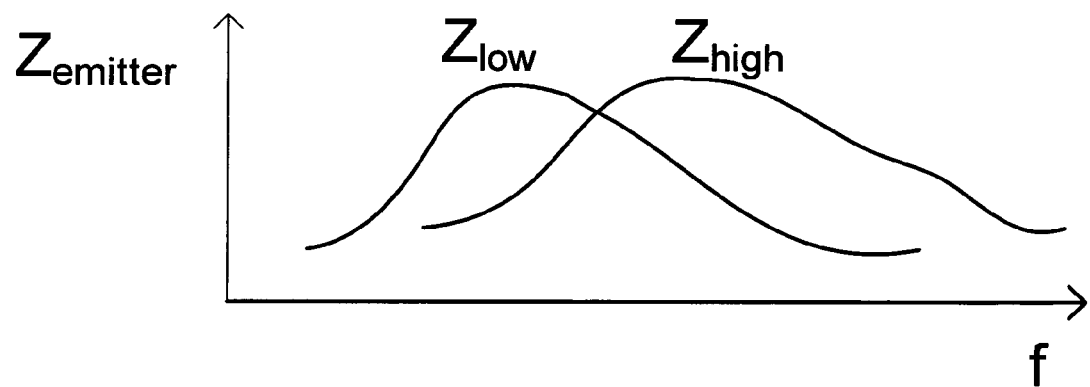
FIG. 7 illustrates the effect of having a VCO device according to an embodiment of the present invention implemented on a high loss silicon substrate.

However, when the proposed dual-band VCO is implemented on a high loss silicon substrate, the peaks of $Z_{low}$ and $Z_{high}$ shown in FIG. 6b will sometimes be smeared out, especially at high frequency (f>10 GHz), as shown in FIG. 7. The reason is that the impedance $Z_{low}$ and $Z_{high}$ is generated by a parallel-connected inductor and capacitor (LC) and on-chip L and C inherently has a poor quality factor Q. Furthermore, the higher the operating frequency the lower the Q values. Such smeared out a peak would in a severe case cause the gain variations between two bands to be too small to enable switching the VCO working at different bands. This problem can be alleviated by adding an active control circuit that boosts the gain of the VCO at one frequency band only.

Figure 8:
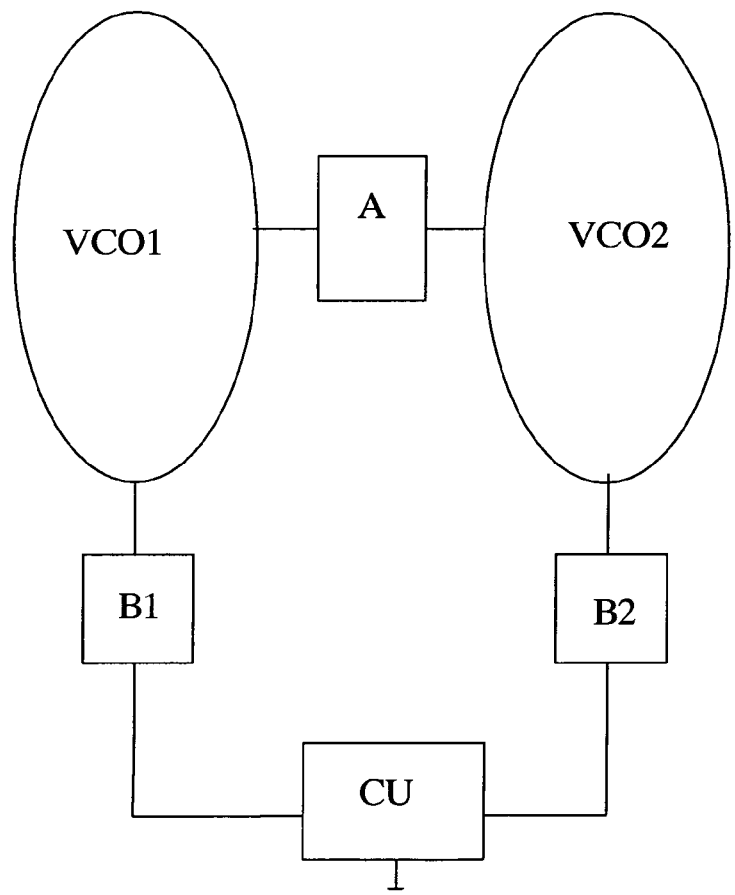
FIG. 8 discloses a further embodiment of a dual-mode VCO device according to the present invention.

With reference FIG. 8, a basic embodiment with an added active control circuit CU will be described. The dual mode VCO circuit, in addition to the components of FIG. 4, comprises an active control circuit CU connected to the respective switching units B1, B2. The active control circuit provides further control of the operation of the VCO by pumping energy into the lumped elements at the switching arrangement.

Figure 9:
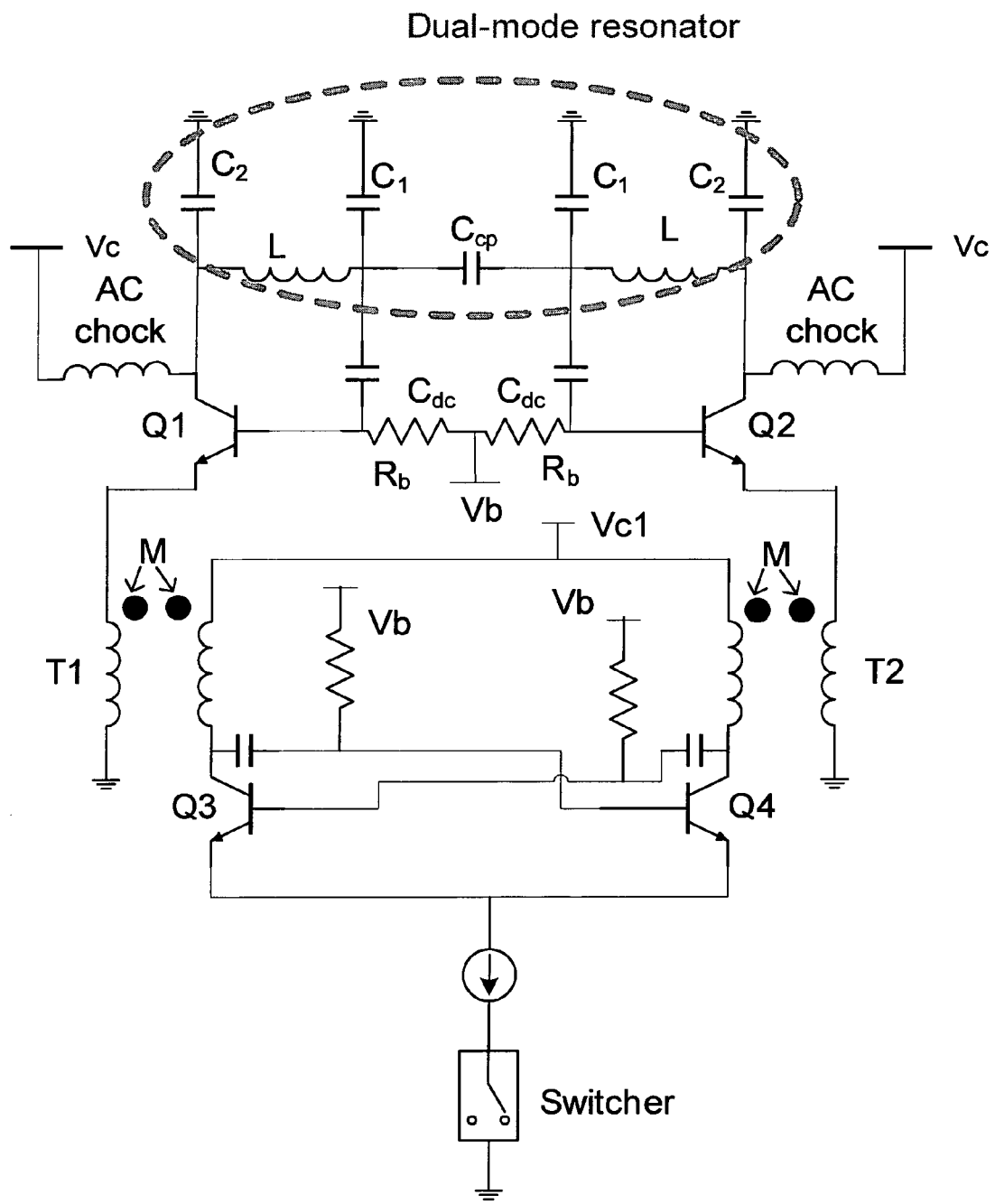
FIG. 9 illustrates a further embodiment of the present invention.

With reference to FIG. 9, a further embodiment of a VCO according to the present invention with the added active control circuit CU will be described. Here, a switched differential amplifier provides the active control and switching. The amplifier consists of a cross-coupled transistor pair Q3 and Q4, which provides gain only for VCO operating at one mode. In this circuit, this mode corresponds to the VCO operating at high frequency band. The power given by differential amplifier is injected into the VCO via two transformers T1 and T2. When this amplifier is turned off by a switcher, those transformers provides inductive emitter degeneration which will suppress the gain at high frequency, therefore the VCO will work at a low frequency band. It should be pointed out that the differential amplifier plays a role of "helper" to boost the gain at the high frequency band. Its gain is typically quite small, since the transistors Q1 and Q2 provide the most power.

Figure 10:
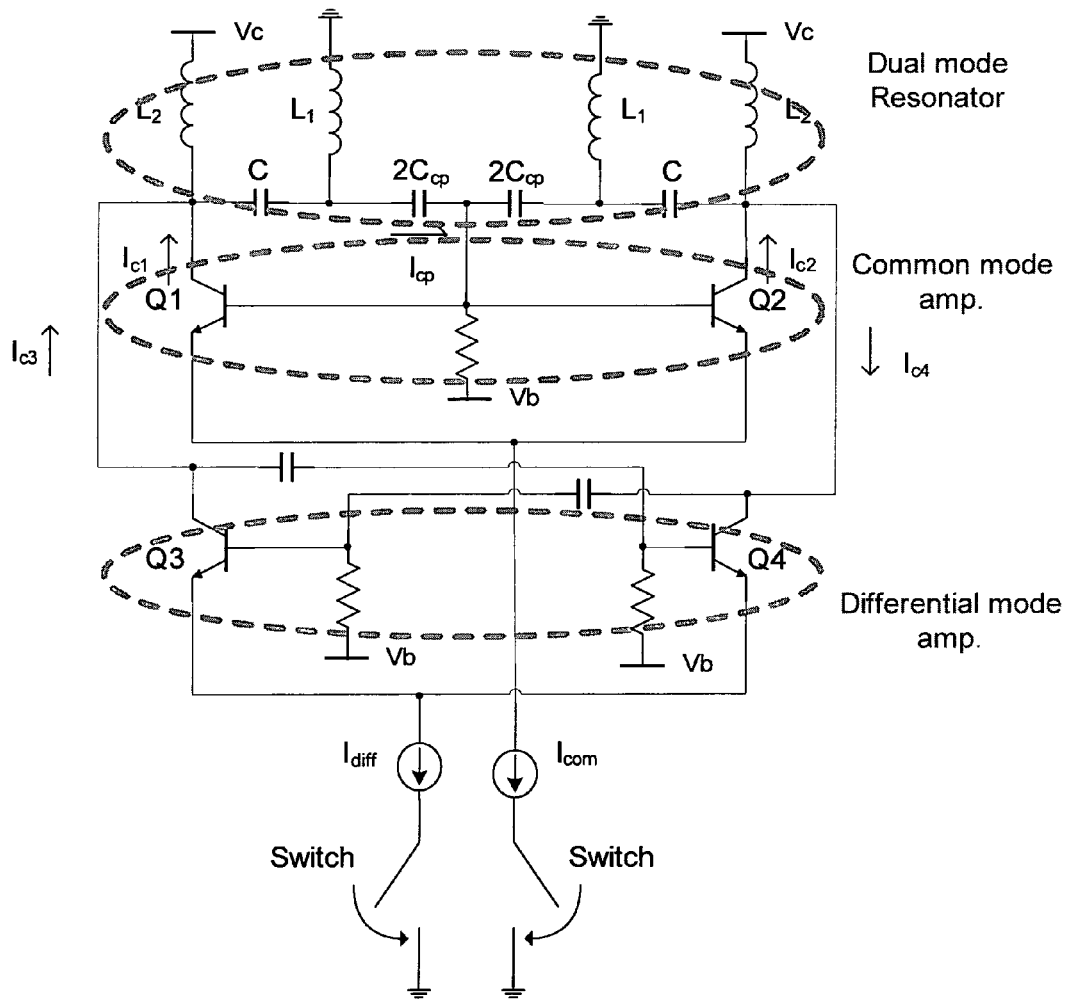
FIG. 10 illustrates yet another embodiment of the present invention.

An additional type of dual-band VCO according to the present invention is shown in FIG. 10, where the same dual-mode resonator as described above is applied. However, the frequency band of the VCO is selected by switching on a common-mode amplifier current $I_{com}$ or a differential-mode amplifier current $I_{diff}$.

Figure 11:
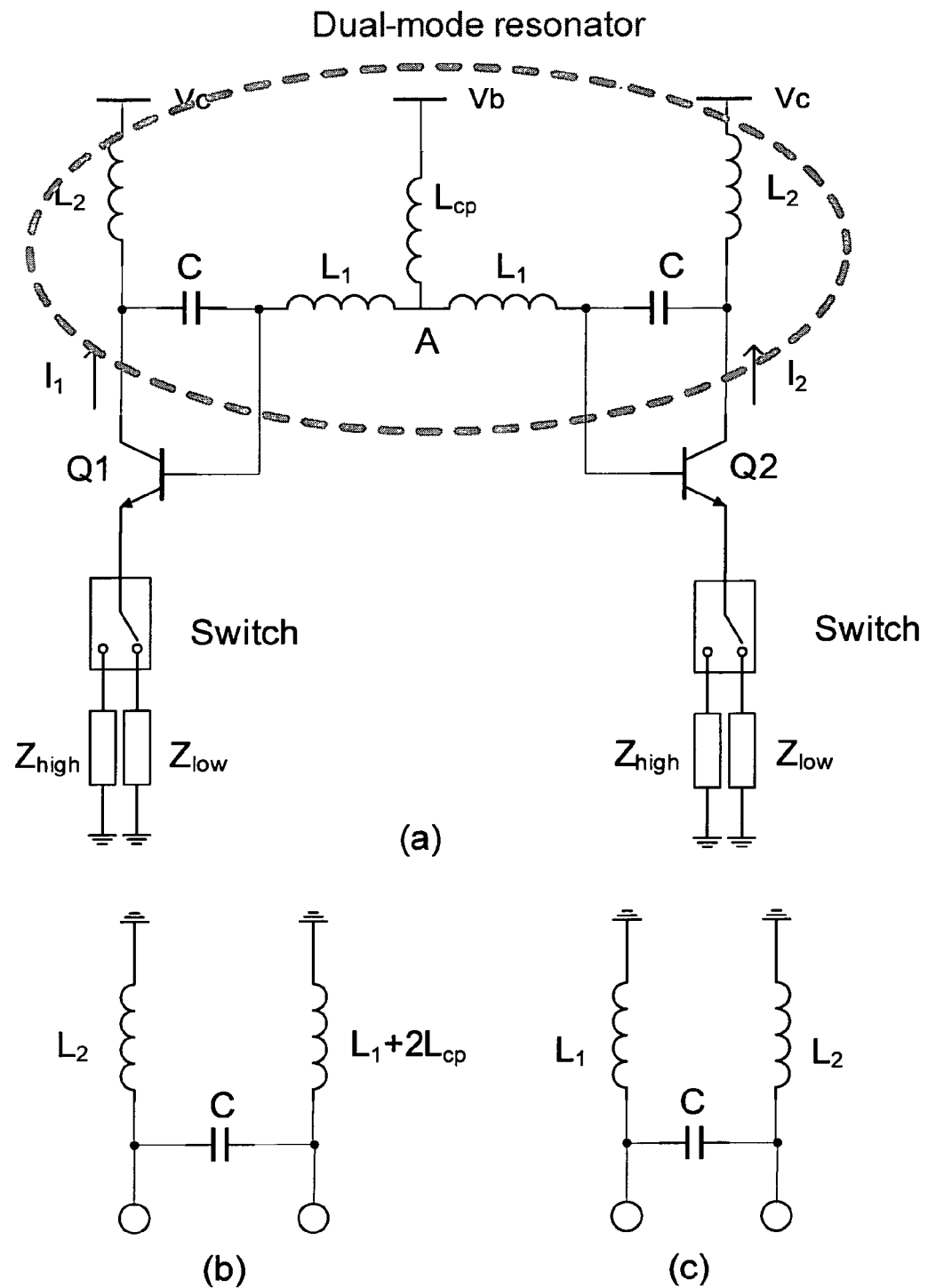

Yet a further type of dual-band VCO according to the present invention is shown in FIG. 11*a*, where a different type of dual-mode resonator is used. Such a dual-band VCO can be viewed as a modified balanced Hartley VCO, i.e. by adding an ac grounded reactive component at the VCO:s virtual ground port, for instance, adding an inductor $L_{cp}$ at point A as shown in FIG. 11*a*.

With reference to the equivalent circuit in FIG. 11*a*, in common-mode, currents $I_1$ and $I_2$ are in-phase, the ac current flows through $L_{cp}$, consequently, $L_{cp}$ becomes a part of resonator, as shown in FIG. 11*b*. In this situation, a balanced Hartley VCO becomes two single ended Hartley VCO's. The oscillation frequency is given by Equation 4:

$$f_c = \frac{1}{2\pi\sqrt{(L_1 + L_2 + 2L_{cp})C}} \quad (4)$$

In the differential-mode currents, $I_1$ and $I_2$ are anti-phase, point A is a virtual ground, and thus, the voltage across inductor $L_{cp}$ is zero and no current flows through $L_{cp}$. Consequently, $L_{cp}$ has no effect on the resonator frequency; therefore, the VCO:s oscillation frequency is the same as that for a balanced Hartley VCO, which is given by Equation 5:

$$f_d = \frac{1}{2\pi\sqrt{(L_1 + L_2)C}} \quad (5)$$

Obviously, the above mentioned inductor $L_{cp}$ can be replaced by some other component, such as a capacitor $C_{cp}$. Furthermore, an ac grounded reactive component such as $L_{cp}$ or $C_{cp}$ can be added at another virtual ground.

Alternatively, two ac grounded reactive components, such as $L_{cp1}$ and $L_{cp2}$, can be added at both a virtual ground A and B simultaneously.

Obviously, together with common-mode/differential mode amplifiers, the above described dual-mode resonators shown can also be used to build a dual-mode VCO, which is similar to that shown in FIG. 10.

Figure 12:
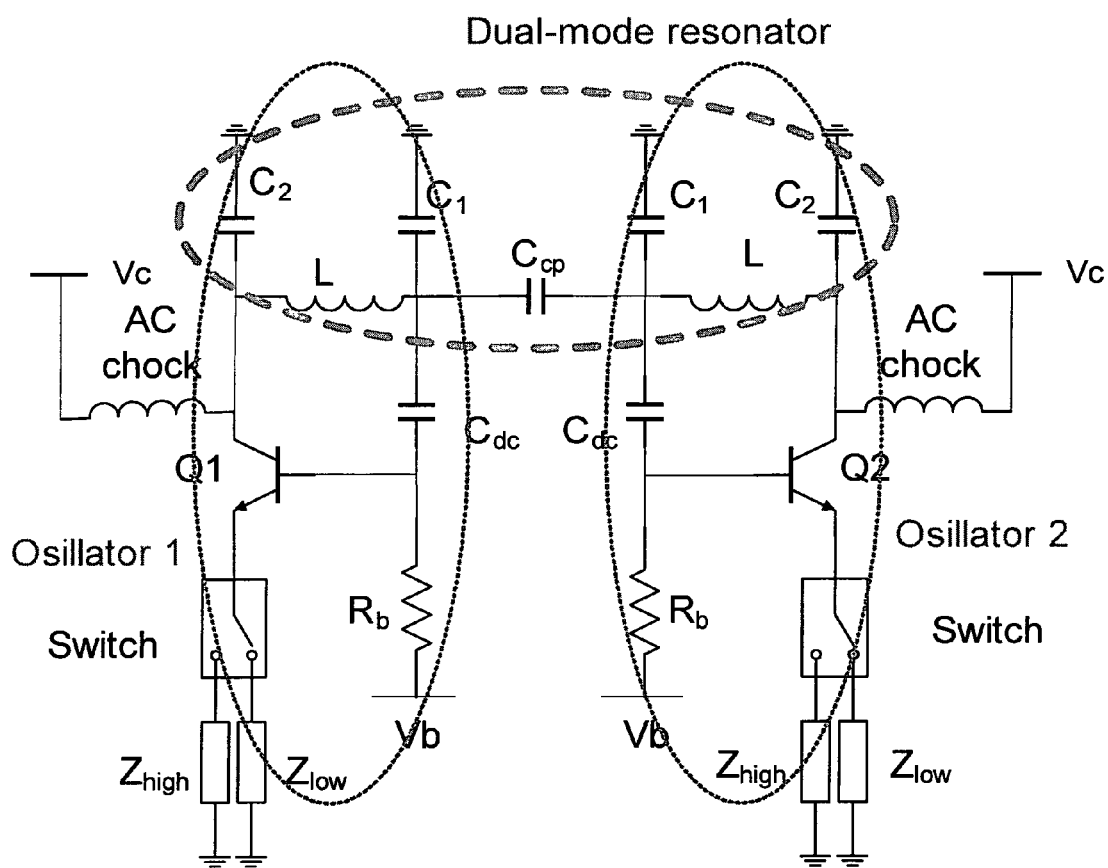
FIG. 12 illustrates an embodiment of a dual-band Colpitts VCO according to the invention.

In the above examples, most dual-mode VCOs are based on Hartley VCOs. Similarly, dual-band VCOs can also be designed by coupling two single-ended Colpitts VCOs, as shown in FIG. 12. Here, the dual-mode resonator is composed of two Colpitts resonator ($C_1$, $C_2$, and L), as well as a coupling capacitor $C_{cp}$. While, the capacitor $C_{dc}$ is used only for dc-decoupling. Corresponding to the resonator operating at common-mode or differential mode, the dual-band VCO has oscillation frequencies according to Equation 6 and Equation 7:

$$f_c = \frac{1}{2\pi\sqrt{(C_1 + C_2)L}} \quad (6)$$

and $$f_d = \frac{1}{2\pi\sqrt{(C_1 + C_2 + 2C_{cp})L}} \quad (7)$$

Other types of dual-band Colpitts VCOs can implemented by modfying a balanced Colpitts VCO by adding a grounded reactive component at the virtual ground A and B, respectively. Of course, the above described dual-mode resonators can also be used to build a dual-band VCO that is similar to that shown in FIG. 6, utilizing common- and differential-mode amplifiers.

Figure 13:
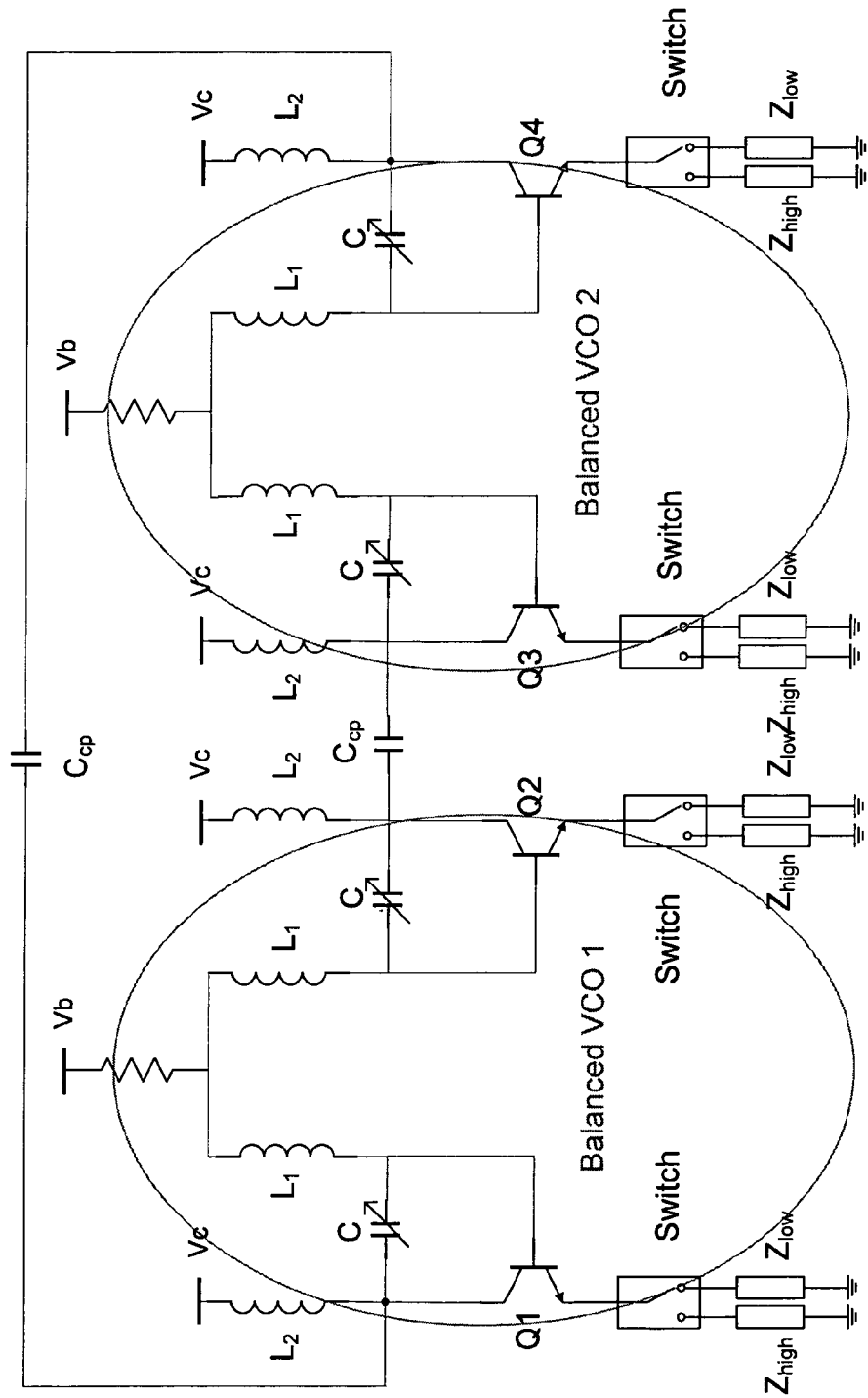
FIG. 13 illustrates a differential dual-band VCO device utilizing the principles of the present invention.

Finally, it should be pointed out that the proposed method to design dual-band VCOs can be easily applied to construct a differential dual-band VCO, in order to drive a differential mixer. For example, two balanced Hartley VCO can be coupled via capacitor $C_{cp}$, as shown in FIG. 13. The phase difference between collect currents of Q2 and Q3 (Q1 and Q4) determines the VOC's frequency band. Nevertheless, the balanced VCO is made up Q1 and Q2 (Q3 and Q4) always delivers the differential signals.

Some of the unique features of the proposed dual-band VCOs are:

There are three methods to build dual-band VCOs based on lumped elements dual-mode resonators: (i) coupling two single-ended Hartley or Colpitts VCO via a reactive component; (ii) adding ac grounded reactive components at virtual grounds of a balanced Hartley or Colpitts VCO; (iii) using common-mode or differential-mode amplifiers to drive a dual-mode resonator.

A dual-mode resonator is made up of two Hartley or Colpitts resonators plus either (i) a coupling reactive component or (ii) an ac grounded reactive component. Such a resonator has two oscillation frequency bands depending on that the injected current is in-phase or anti-phase.

Amplifiers in the dual-band VCO provide sufficient gain to maintain VCO oscillating at only one frequency band. It is realized by either (i) switched emitter degeneration (impedance) or (ii) switching between common-mode amplifier and differential-mode amplifier or (iii) active controlling.

The frequency difference of two frequency bands depends on the impedance of the coupling reactive component or the impedance of the ac grounded reactive component.

The frequency difference of two frequency bands depends on the impedance of the coupling reactive component or the impedance of the ac grounded reactive component.

Two balanced Hartley/Colpitts VCOs coupled via reactive components can make up a differential dual-band VCO which provides differential signal at two frequency band.

Advantages of the present invention include:

Unlike switched capacitors/inductors, the switches in our VCO are not connected with the resonator directly; thus, the phase noise and tuning range is not deteriorated by switches.

Unlike transformers dual-mode resonators, our dual-mode resonator's quality factor is not associated with the resonator mode, i.e. frequency band.

The proposed VCO topology can be implemented in any semiconductor technology, e.g. CMOS, HBT in Silicon, HBT, FET in GaAs etc. The proposed VCO topology can be implemented in both MMICs or discrete components circuits.

It will be understood by those skilled in the art that various modifications and changes may be made to the present invention without departure from the scope thereof, which is defined by the appended claims.

REFERENCES

[1] A. Mazzanti, P. Uggetti, R. Battaglia, and F. Svelto, "*Analysis and design of a dual-band reconfigurable VCO*", Proc. Of the 2004, 11$^{th}$ IEEE Electronics, Circuits and Systems, pp. 37-41, 2004.

[2] S. S. Broussev, T. A. Lehtonen, and N. T. Tchamov, "*A wideband low phase noise LC-VCO with programmable kVCO*", IEEE Microwave and Wireless Components Letters, 2007.

[3] B. Cath and M. Hella, "*Dual-band ultra-wide tuning rang CMOS voltage controlled oscillator*", Electronics letters, Vo. 42, No. 21, October, 2006.

APPENDIX 1

Mutual Inductance

Mutual inductance M is the concept that the current through one inductor can induce a voltage in another nearby inductor. It is important as the mechanism by which transformers work, but it can also cause coupling between conductors in a circuit.

The mutual inductance M is also a measure of the coupling between two inductors. The mutual inductance by circuit i on circuit j is given by the double integral Neumann formula $$M_{ij} = \frac{\mu_0}{4\pi} \oint_{C_i} \oint_{C_j} \frac{ds_i ds_j}{|R_{ij}|}$$

Dot Convention

In circuit analysis, the dot convention is used to denote the voltage polarity of the mutual inductance of two components. (Reference is made to FIG. 4 of this disclosure).

Two good ways to think about this convention:

1. The current goes into one dot (either dot) "tries" to come out of the other dot. "Into" meaning from the dot toward the inductor, and conversely "out" meaning from the inductor toward the dot.

2. Current going into a dotted terminal of the inductor induces a positive voltage at the other dot. Conversely, current leaving a dotted terminal induces a negative voltage at the other dot.

The invention claimed is:

1. A dual-band capable voltage controlled oscillator device, comprising:
    a reactive component;
    a first external switching device;
    a second external switching device;
    a first voltage controlled oscillator unit (VCO1); and
    a second voltage controlled oscillator unit (VCO2), wherein
    the first voltage controlled oscillator unit (VCO1) and the second voltage controlled oscillator unit (VCO2) are coupled via the reactive component,
    the first voltage controlled oscillator unit (VCO1) is connected to the first external switching device,
    the second voltage controlled oscillator unit (VCO2) is connected to the second external switching device,
    the first and second external switching devices are adapted to control an operating frequency of the VCO, and
    each said external switching device comprises lumped elements configured to utilize mutual inductance.

2. The device according to claim 1, wherein said first and second external switching devices are configured to provide a frequency band of said VCO device based whether an ac current flows at said reactive component or not.

3. The device according to claim 2, further comprising a control unit (CU) configured to actively control said ac current.

4. The device according to claim 1, wherein said reactive component is a coupling reactive component.

5. The device according to claim 1, wherein said reactive component is an ac grounded reactive component.

6. The device according to claim 1, wherein said first and second voltage controlled oscillator unit (VCO1 and VCO2) are Hartley voltage controlled oscillators.

7. The device according to claim 1, wherein said first and second voltage controlled oscillator unit (VCO1 and VCO2) are Colpitts voltage controlled oscillators.

8. The device according to claim 1, further comprising a common-mode amplifier.

9. The device according to claim 1, further comprising a differential-mode amplifier.

10. A dual-band capable voltage controlled oscillator (VCO), comprising:
    a first oscillator unit; a second oscillator unit; a reactive component;
    a differential amplifier;
    a first transformer;
    a second transformer; and
    a switch, wherein
    the first oscillator unit and the second oscillator unit are coupled via the reactive component,
    the first oscillator unit is connected to the differential amplifier via the first transformer,
    the second oscillator unit is connected to the differential amplifier via the second transformer,
    the differential amplifier is connected to the switch, and
    the switch is operable to turn off the differential amplifier.

11. The VCO of claim 10, wherein
    the first oscillator unit comprises a first resonator circuit,
    the second oscillator unit comprises a second resonator circuit,
    a first terminal of the reactive component is connected to a node of the first resonator circuit, and
    a second terminal of the reactive component is connected to a node of the second resonator circuit.

12. The VCO of claim 10, wherein the VCO is configured such that power that is produced by the differential amplifier is injected into the oscillator units.

13. The VCO of claim 10, wherein the VCO is configured such that when the differential amplifier is turned off by the switch the transformers provide inductive emitter degeneration.

14. A dual-band capable voltage controlled oscillator (VCO), comprising:
   a dual mode resonator;
   a common mode amplifier connected to the dual mode resonator;
   a differential mode amplifier connected to the common mode amplifier and to the dual mode resonator;
   a first current source connected to the common mode amplifier;
   a second current source connected to the differential mode amplifier;
   a first switch for connecting and disconnecting the first current source from a ground node; and
   a second switch for connecting and disconnecting the second current source from the ground node.

* * * * *